United States Patent
Shiino et al.

(10) Patent No.: US 8,605,514 B2
(45) Date of Patent: Dec. 10, 2013

(54) NONVOLATILE SEMICONDUCTOR MEMORY DEVICE

(75) Inventors: Yasuhiro Shiino, Yokohama (JP); Eietsu Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 12/885,066

(22) Filed: Sep. 17, 2010

(65) Prior Publication Data

US 2011/0228608 A1 Sep. 22, 2011

(30) Foreign Application Priority Data

Mar. 19, 2010 (JP) ................................ 2010-064738

(51) Int. Cl.
*G11C 11/40* (2006.01)

(52) U.S. Cl.
USPC ............ 365/185.26; 365/185.18; 365/185.24

(58) Field of Classification Search
USPC ........................... 365/185.18, 185.24, 185.26
See application file for complete search history.

(56) References Cited

U.S. PATENT DOCUMENTS

| | | | |
|---|---|---|---|
| 6,175,522 B1 * | 1/2001 | Fang | 365/185.18 |
| 7,355,888 B2 | 4/2008 | Hemink et al. | |
| 2006/0126399 A1 * | 6/2006 | Cho et al. | 365/185.33 |
| 2007/0258276 A1 * | 11/2007 | Higashitani | 365/10 |
| 2007/0297233 A1 * | 12/2007 | Maejima | 365/185.17 |
| 2008/0037327 A1 * | 2/2008 | Park et al. | 365/185.19 |
| 2008/0165585 A1 * | 7/2008 | Surico et al. | 365/185.22 |
| 2008/0205163 A1 * | 8/2008 | Park et al. | 365/185.23 |
| 2010/0034020 A1 | 2/2010 | Tanaka et al. | |
| 2011/0222348 A1 * | 9/2011 | Kim et al. | 365/185.18 |
| 2011/0228608 A1 | 9/2011 | Shiino et al. | |
| 2012/0281487 A1 | 11/2012 | Sakaniwa et al. | |
| 2013/0058170 A1 | 3/2013 | Shiino et al. | |

FOREIGN PATENT DOCUMENTS

| | | |
|---|---|---|
| JP | 2004-127346 A | 4/2004 |
| JP | 2009-520314 | 5/2009 |
| JP | 2009-176372 A | 8/2009 |
| WO | WO 2007/078793 A1 | 7/2007 |

OTHER PUBLICATIONS

Machine translation of abstract of Japanese publication 2009-176372 A, item AO of the IDS submitted by applicant on Oct. 12, 2012.*
Machine translation of Japanese publication 2004-127346 A, item AP of the IDS submitted by applicant on Oct. 12, 2012.*
Office Action issued Jul. 24, 2012, in Japanese Patent Application No. 2010-064738 with English translation.

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

According to one embodiment, a nonvolatile semiconductor memory device comprises a first memory cell, a second memory cell, and a control circuit. The first memory cell is connected to a first word line. The second memory cell is connected to a second word line which is adjacent to the first word line and has a width different from a width of the first word line. The control circuit applies a first voltage to the first word line and a second voltage different from the first voltage to the second word line. At least one of the first voltage and the second voltage is corrected by the control circuit based on write loop counts of the first memory cell and the second memory cell when the first memory cell and the second memory cell are write target cells in a write operation.

16 Claims, 13 Drawing Sheets

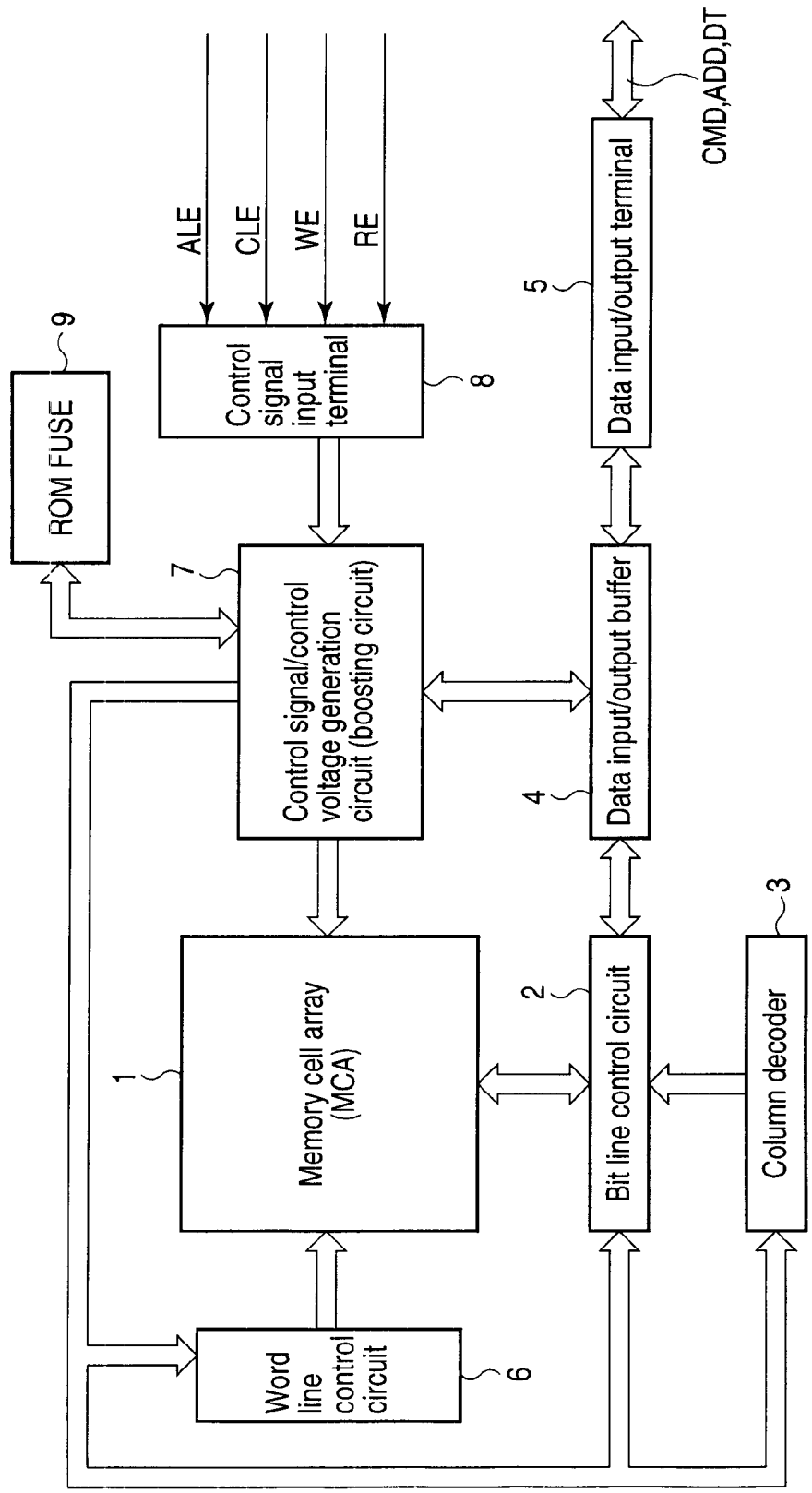
F I G. 1

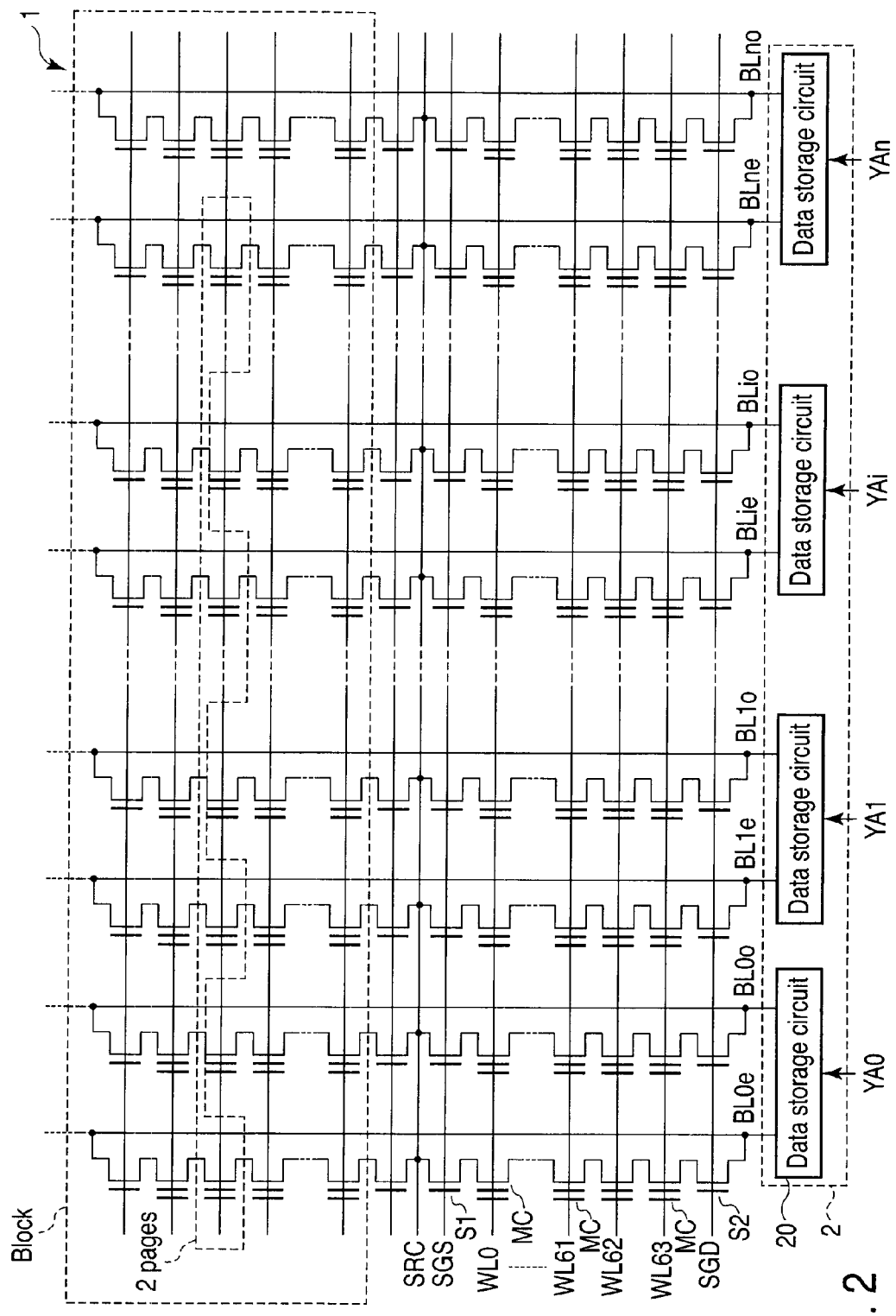
F I G. 2

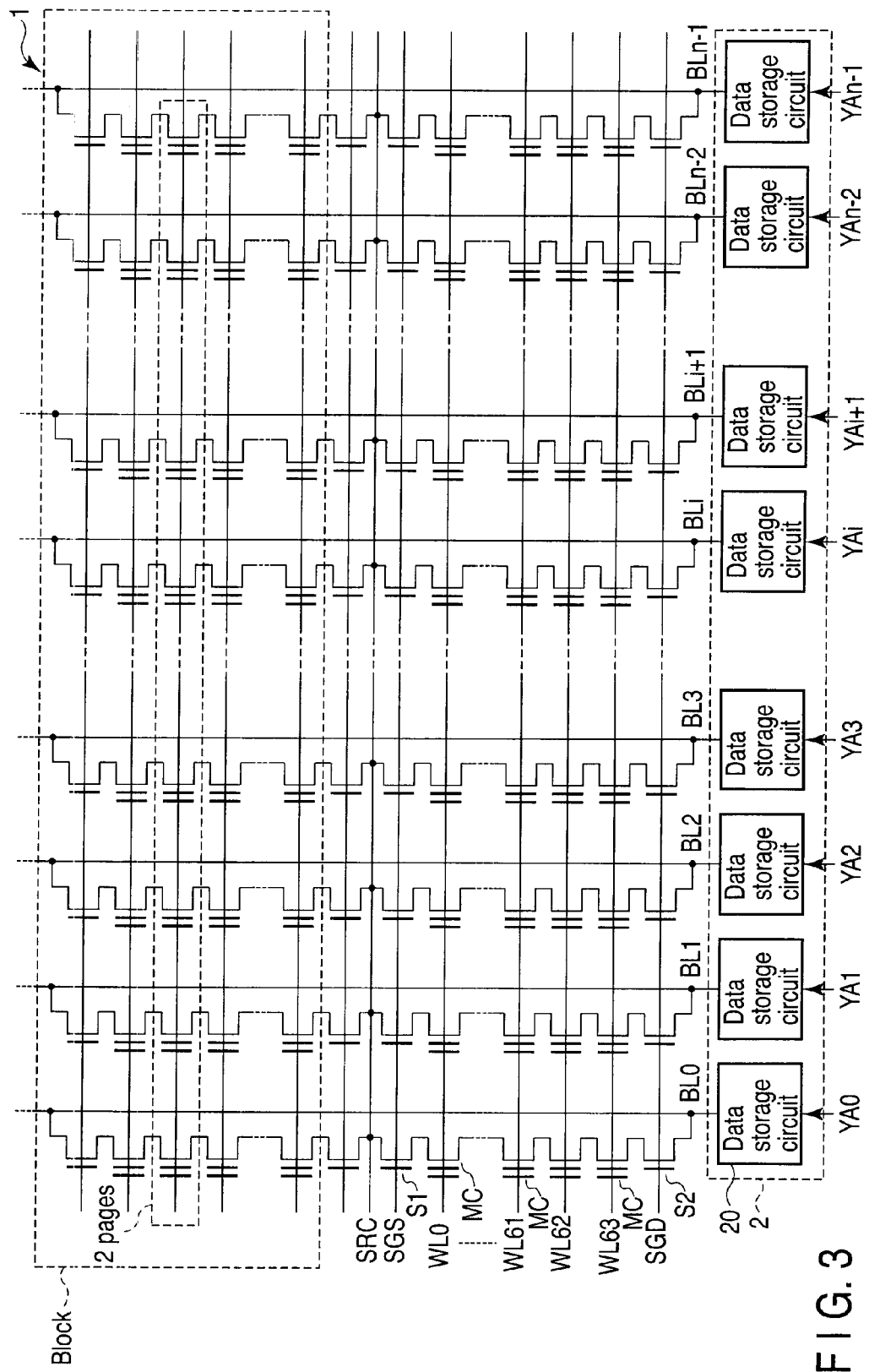
F I G. 3

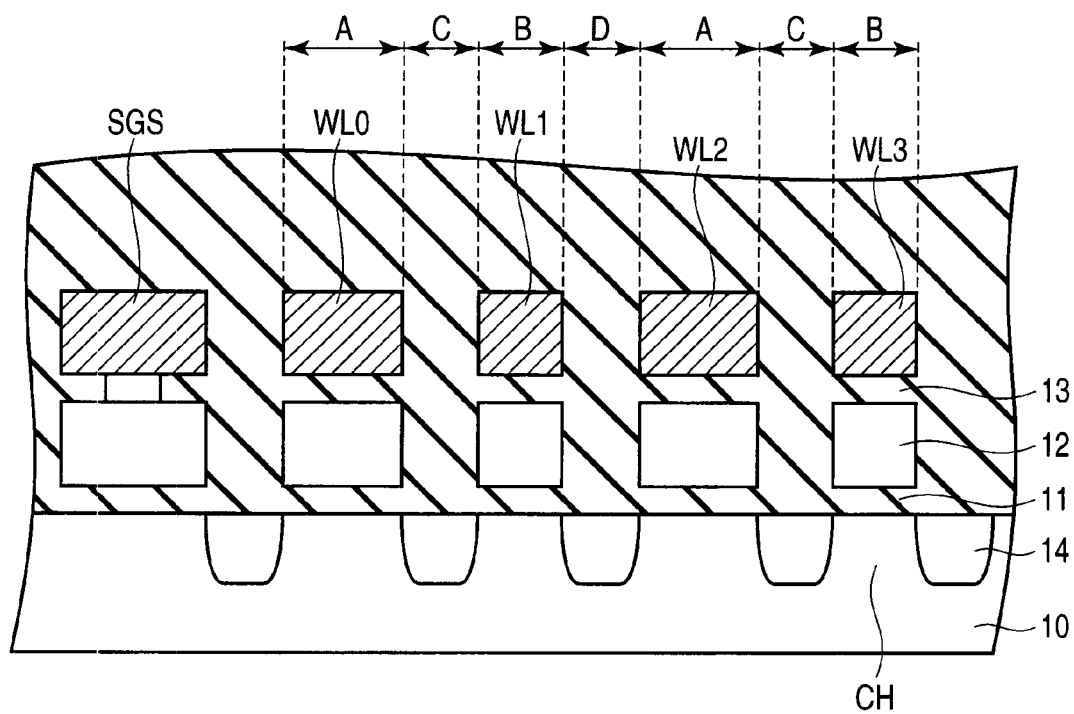
F I G. 4

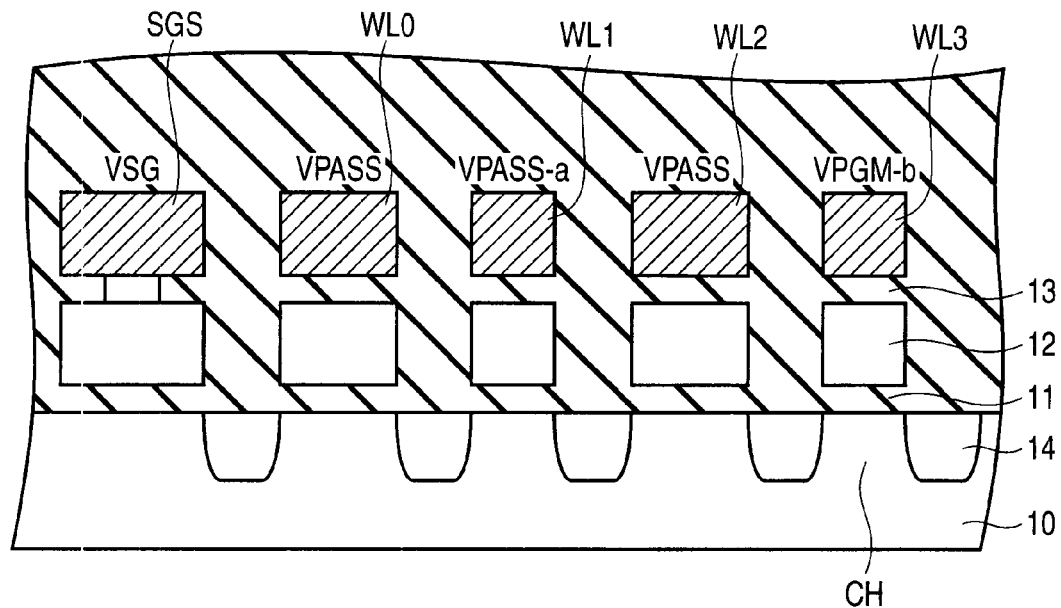
F I G. 5 A
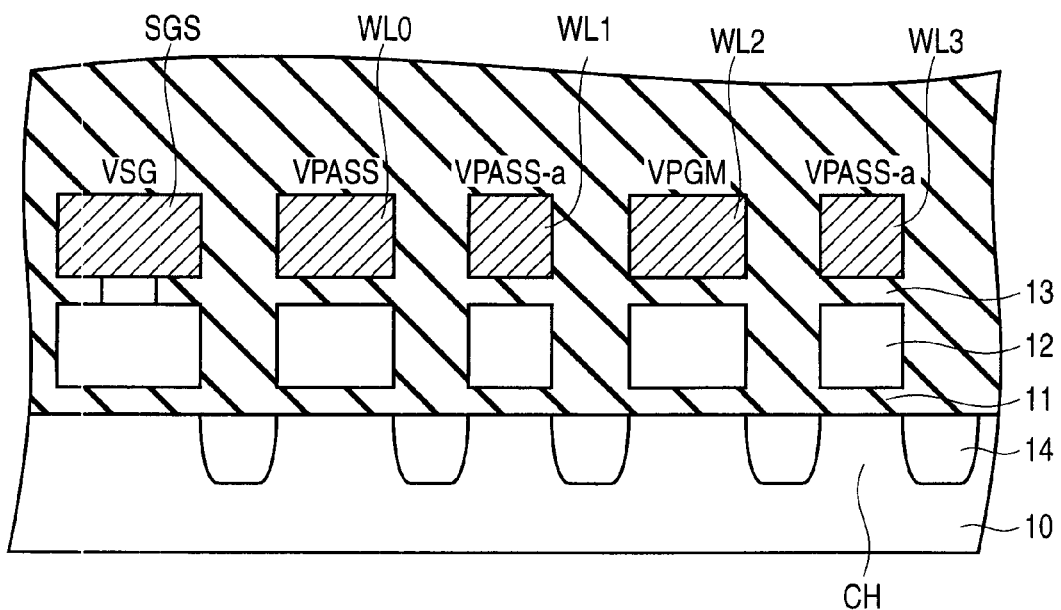
F I G. 5 B

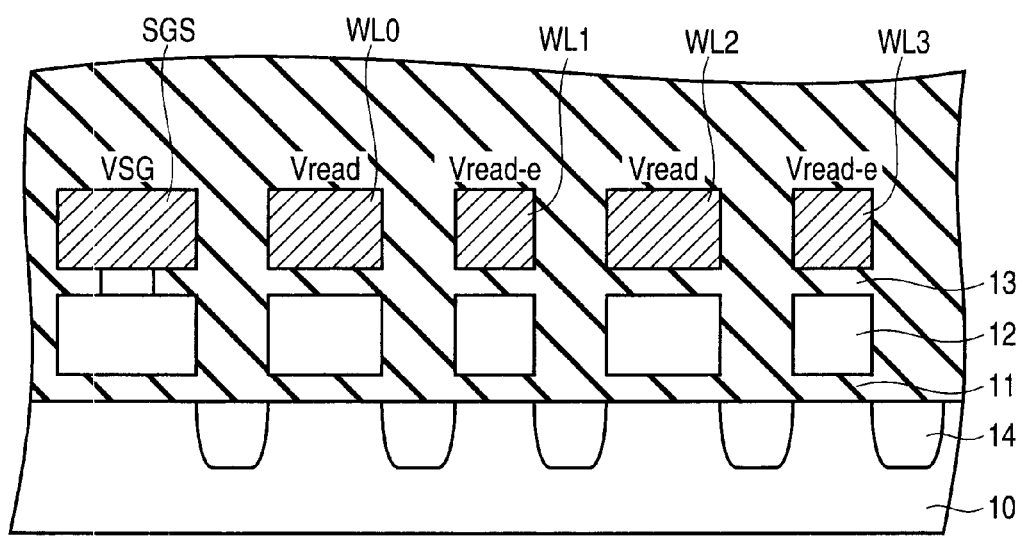
F I G. 12

NONVOLATILE SEMICONDUCTOR MEMORY DEVICE

CROSS-REFERENCE TO RELATED APPLICATIONS

This application is based upon and claims the benefit of priority from Japanese Patent Application No. 2010-064738, filed Mar. 19, 2010; the entire contents of which are incorporated herein by reference.

FIELD

Embodiments described herein relate generally to a nonvolatile semiconductor memory device.

BACKGROUND

A NAND flash memory is known as one of EEPROMs. The NAND flash memory comprises NAND cell units each having a small unit area and including memory cells connected in series. The NAND cell units form a memory cell array. Hence, the NAND flash memory can implement a large storage capacity as compared to a NOR flash memory.

A recent NAND flash memory needs microfabrication of memory cells to further increase the storage capacity. As a manufacturing method for such memory cell microfabrication, a sidewall patterning process has been proposed.

However, the sidewall patterning process generates a difference in dimension between gate electrodes of two adjacent memory cells. This difference in dimension leads to errors in predetermined operations (write, read, and erase) in which voltages are applied to the word lines.

In, for example, a programming operation, a single write pass voltage VPASS is applied to all the word lines of non-write target cells normally. However, the required value of VPASS to be applied to the word lines changes between adjacent memory cells because of the difference in dimension of gate electrodes. Not only the difference in dimension of gate electrodes but also a difference in, for example, channel length, diffusion layer width, impurity concentration, or dimension (space) between adjacent memory cells also changes the required value of VPASS to be applied to the word lines between adjacent memory cells. For this reason, FBC (Failure Bit Count) largely increases in a memory cell connected to a word line to which VPASS of required value is not applied.

BRIEF DESCRIPTION OF THE DRAWINGS

FIG. 1 is a block diagram of a nonvolatile semiconductor memory device according to an embodiment;

FIG. 2 is a circuit diagram showing an example of a memory cell array in FIG. 1;

FIG. 3 is a circuit diagram showing another example of the memory cell array in FIG. 1;

FIG. 4 is a sectional view taken along the column direction of the memory cell array according to the embodiment;

FIG. 5A is a sectional view showing an example of a first write method for memory cells according to the embodiment;

FIG. 5B is a sectional view showing another example of the first write method for memory cells according to the embodiment;

FIG. 12 is a sectional view showing an example of a read method for memory cells according to the embodiment;

DETAILED DESCRIPTION

Figure 6:
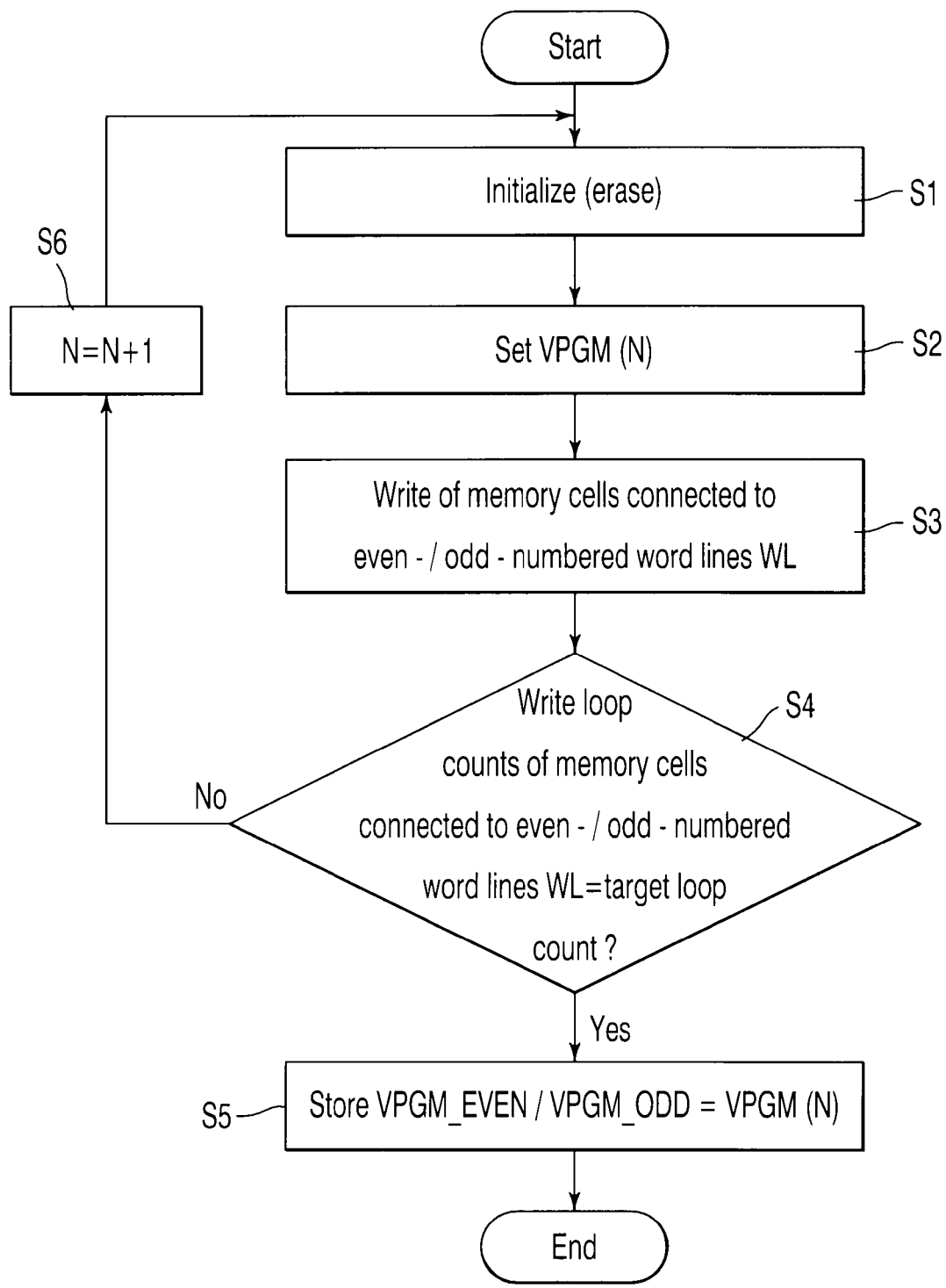
FIG. 6 is a flowchart of trimming of the first write method for memory cells according to the embodiment.

In general, according to one embodiment, a nonvolatile semiconductor memory device comprises a first memory cell, a second memory cell, and a control circuit. The first memory cell is connected to a first word line. The second memory cell is connected to a second word line which is adjacent to the first word line and has a width different from a width of the first word line. The control circuit applies a first voltage to the first word line and a second voltage different from the first voltage to the second word line. At least one of the first voltage and the second voltage is corrected by the control circuit based on loop counts of the first memory cell and the second memory cell when the first memory cell and the second memory cell are write target cells in a write operation.

An embodiment will now be described with reference to the accompanying drawing. The same reference numerals denote the same parts throughout the drawing.

[Example of Overall Arrangement]

The overall arrangement of a nonvolatile semiconductor memory device according to the embodiment will be explained first.

FIG. 1 is a block diagram of the nonvolatile semiconductor memory device according to an embodiment. As shown in FIG. 1, the nonvolatile semiconductor memory device comprises a memory cell array 1, bit line control circuit 2, column decoder 3, data input/output buffer 4, data input/output terminal 5, word line control circuit 6, control signal/control voltage generation circuit 7, control signal input terminal 8, and ROM FUSE 9.

The memory cell array 1 includes bit lines, word lines, and a common source line, and comprises memory cells arranged in a matrix. Memory cells are formed from, for example, an EEPROM cells. Memory cells arranged in the column direction form a NAND cell unit. The bit line control circuit 2 and the word line control circuit 6 are connected to the memory cell array 1.

The bit line control circuit 2 reads out data from a memory cell in the memory cell array 1 via a bit line, detects the state of a memory cell in the memory cell array 1 via a bit line, or applies a write control voltage to a memory cell in the memory cell array 1 via a bit line to write data in the memory cell. The column decoder 3 and the data input/output buffer 4 are connected to the bit line control circuit 2. The column decoder 3 selects a data storage circuit in the bit line control circuit 2. Data of a memory cell read out to the data storage circuit is output from the data input/output terminal 5 to the outside via the data input/output buffer 4. The data input/output terminal 5 is connected to a host (not shown) outside the memory chip. The host is formed from, for example, a microcomputer, and receives the data output from the data input/output terminal 5. The host also outputs various commands CMD, addresses ADD, and data DT to control the operation of the NAND flash memory. Write data input from the host to the data input/output terminal 5 is supplied, via the data input/output buffer 4, to a data storage circuit selected by the column decoder 3. Commands and addresses are supplied to the control signal/control voltage generation circuit 7.

The word line control circuit 6 is connected to the memory cell array 1. The word line control circuit 6 selects a word line in the memory cell array 1, and applies a voltage necessary for read, write, or erase to the selected word line.

The ROM FUSE 9 stores data concerning voltages applied to the word lines in the write operation. More specifically, the ROM FUSE 9 stores, for example, data of various voltages (to be described later) obtained by trimming in a die sorting test before shipment. In place of the ROM FUSE 9, a storage circuit may be provided at part of the memory cell array 1.

The control signal/control voltage generation circuit 7 is connected to the memory cell array 1, bit line control circuit 2, column decoder 3, data input/output buffer 4, word line control circuit 6, and ROM FUSE 9, and controls them. The control signal/control voltage generation circuit 7 is connected to the control signal input terminal 8 and controlled by control signals ALE (Address Latch Enable), CLE (Command Latch Enable), WE (Write Enable), and RE (Read Enable) input from the host via the control signal input terminal 8. In data write, the control signal/control voltage generation circuit 7 generates voltages of word lines and bit lines, and also generates a voltage to be supplied to the well. The control signal/control voltage generation circuit 7 includes a boosting circuit such as a charge pump circuit so as to be able to generate a program voltage and other high voltages. The control signal/control voltage generation circuit 7 can also control voltages to be generated in accordance with each region of the memory cell array 1.

The bit line control circuit 2, column decoder 3, word line control circuit 6, and control signal/control voltage generation circuit 7 form a write circuit and a read circuit.

FIG. 2 illustrates an arrangement example of the memory cell array 1 and the bit line control circuit 2 shown in FIG. 1. As shown in FIG. 2, NAND cell units are arranged in the memory cell array 1. One NAND cell unit includes, for example, 64 memory cells MC and select gates S1 and S2, the memory cells MC formed from, for example, EEPROMs and to which current paths are connected in series. The select gate S2 is connected to a bit line BL0e, and the select gate S1 is connected to a source line SRC. The control gates of the memory cells MC arranged on each row are commonly connected to a corresponding one of word lines WL0 to WL63. The select gates S2 are commonly connected to a select line SGD, and the select gates S1 are commonly connected to a select line SGS.

The bit line control circuit 2 includes data storage circuits 20. Pairs of bit lines BL0e and BL0o, BL1e and BL1o, ..., BLie and BLio, ..., BLne and BLno are connected to the each data storage circuit 20.

The memory cell array 1 includes blocks, as indicated by the broken line. Each block includes NAND cell units which are connected to WL0 to WL63 in common and arranged in a row direction. For example, data is erased in blocks. The erase operation is performed simultaneously for two bit lines connected to one data storage circuit 20.

Memory cells arranged on alternate bit lines and connected to one word line (memory cells surrounded by the broken line) form one sector. Data write and read are done in sectors. More specifically, half of the memory cells arranged in the row direction are connected to corresponding bit lines. For this reason, the write or read operation is performed for every half of the memory cells arranged in the row direction.

In the read, program verify, and programming operations, one of two bit lines BLie and BLio connected to each data storage circuit 20 is selected in accordance with externally supplied address signals YA0, YA1, ..., YAi, ..., YAn. Additionally, one word line is selected in accordance with an external address, thereby selecting two pages indicated by the broken line. The 2-page switching is done by an address.

The 2-page processing is performed when each cell stores two bits. One-page processing is done for cells each storing one bit, 3-page processing for cells each storing three bits, and 4-page processing for cells each storing four bits.

FIG. 3 illustrates another arrangement example of the memory cell array 1 and the bit line control circuit 2 shown in FIG. 1. In the arrangement of FIG. 2, two bit lines BLie and BLio are connected to each data storage circuit 20. In the arrangement of FIG. 3, however, the data storage circuit 20 is connected to each bit line so that all the memory cells arranged in the row direction are connected to corresponding bit lines. For this reason, the write or read operation can be performed for all memory cells arranged in the row direction.

Note that the embodiment is applicable to both the arrangement of FIG. 2 and that of FIG. 3.

[First Write Method]

A first write method according to this embodiment will be described below with reference to FIGS. 4, 5A, and 5B.

FIG. 4 is a sectional view taken along the column direction of the memory cells and select gates according to the embodiment. FIG. 4 illustrates, for example, the select gate S1 connected to the select line SGS and the memory cells MC connected to the word lines WL0 to WL3 shown in FIG. 2 or 3.

As shown in FIG. 4, each memory cell is formed from a substrate 10, gate insulating film 11, floating gate 12, insulating film 13, and a word line WL serving as a control gate electrode.

A diffusion layer 14 serving as a source or drain is formed in the substrate 10 between two adjacent memory cells. Channel regions CH are formed between the diffusion layers 14. The floating gate 12 is formed on the gate insulating film 11 on the channel region CH in the substrate 10. The control gate electrode serving as the word line WL is formed on the insulating film 13 on the floating gate 12.

The memory cells connected to the word lines WL0 to WL3 alternately change the size. More specifically, for example, a dimension (column-direction width) A of the gate electrodes of the memory cells connected to the even-numbered word lines WL0 and WL2 is larger than a dimension B of the gate electrodes of the memory cells connected to the odd-numbered word lines WL1 and WL3. Such a difference in dimension between memory cells is generated by the sidewall patterning process.

In the sidewall patterning process, a first film serving as a patterned core is formed on a film to be processed by lithography or the like. A second film is formed on the sidewall of the first film, and the first film is removed. Then, the film to be processed is etched using the remaining second film as a mask, thereby forming a gate electrode. This sidewall patterning process allows to form a gate electrode pattern beyond the limitation of lithography resolution.

Note that although this embodiment mainly describes a case in which the difference in dimension is generated between two adjacent memory cells, the sidewall patterning process may generate the difference in dimension between three or more adjacent memory cells. The sidewall patterning process may change the dimension (space) between adjacent memory cells. More specifically, a dimension C between the memory cell connected to the word line WL0 and that connected to the word line WL1 is different from a dimension D between the memory cell connected to the word line WL1 and that connected to the word line WL2. Similarly, the width of the diffusion layer 14 or the impurity concentration may differ between adjacent memory cells.

FIGS. 5A and 5B show the first write method for memory cells according to the embodiment. FIG. 5A illustrates a case in which data is written in the memory cell connected to the word line WL3 (odd-numbered word line WL). FIG. 5B illustrates a case in which data is written in the memory cell connected to the word line WL2 (even-numbered word line WL).

As shown in FIG. 5A, to write data in the memory cell connected to the word line WL3, a write voltage is applied to the word line WL3, a write pass voltage is applied to the word lines WL0 to WL2, and a select gate voltage VSG is applied to the select line SGS.

More specifically, a write voltage VPGM-b different from a normal write voltage VPGM is applied to the word line WL3 connected to the write target cell. The value b is a positive or negative voltage value, and serves as a correction value determined in accordance with the write characteristic of the write target cell (the memory cell connected to the odd-numbered word line WL). More specifically, the value b is set in advance by trimming based on a result of test conducted for, e.g., each chip or each block shown in FIG. 2 or 3. Details of the trimming will be explained later. The value b is stored in, for example, the ROM FUSE 9 shown in FIG. 1.

On the other hand, a write pass voltage VPASS is applied to the word lines WL0 and WL2 connected to non-write target cells, and VPASS-a different from the normal write pass voltage VPASS is applied to the word line WL1. The value a is a positive or negative voltage value which is determined by the control signal/control voltage generation circuit 7 shown in FIG. 1 based on the correction value b. That is, in the odd-numbered word lines WL1 and WL3, not only the write voltage VPGM but also the write pass voltage VPASS is corrected in accordance with the write characteristic. The value a is, for example, proportional to the value b, but is mainly defined by the dimension of the memory cell (or channel length, diffusion layer width, impurity concentration, or space). VPASS-a is applied to all the odd-numbered word lines WL connected to non-write target cells, although not illustrated.

As shown in FIG. 5B, to write data in the memory cell connected to the word line WL2, a write voltage is applied to the word line WL2, and write pass voltages are applied to the word lines WL0, WL1, and WL3.

More specifically, the write voltage VPGM is applied to the word line WL2 connected to the write target cell.

On the other hand, the write pass voltage VPASS is applied to the word line WL0 connected to the non-write target cell, and VPASS-a (a is a positive or negative voltage value) is applied to the word lines WL1 and WL3. That is, even when writing data in the memory cell connected to the even-numbered word line WL wider than the odd-numbered word line WL, VPASS-a is applied to all the odd-numbered word lines WL connected to non-write target cells, as in FIG. 5A.

Note that although in FIGS. 5A and 5B, the write voltage VPGM and the write pass voltage VPASS are used as values corresponding to the even-numbered word lines WL, and the voltages to be applied to the odd-numbered word lines WL are corrected, the embodiment is not limited to this. That is, the write voltage VPGM and the write pass voltage VPASS may be used as values corresponding to the odd-numbered word lines WL, and the voltages to be applied to the even-numbered word lines WL may be corrected.

FIG. 6 is a flowchart of trimming at the time of die sorting test in the first write method for memory cells according to the embodiment.

As shown in FIG. 6, in step S1, the memory cells are initialized. The memory cells are thus erased.

In step S2, the write voltage VPGM(N) is set. More specifically, write voltages VPGM_EVEN(N) and VPGM_ODD(N) to be applied to the even- and odd-numbered word lines WL, respectively, are set.

In step S3, write of the memory cells connected to the even- and odd-numbered word lines WL is performed in each page. More specifically, the write voltages VPGM_EVEN(N) and VPGM_ODD(N) are applied to the even- and odd-numbered word lines WL, respectively. After the write operation, a verify operation is performed. If there is a memory cell whose threshold voltage has not reached the verify level, the write voltage is stepped up, and the write operation is performed again for the memory cell with the threshold voltage below the verify level. This operation is repeated until the threshold voltage reaches the verify level in all memory cells of one page. At this time, the number of repetitions (loop count) is counted. This write operation is performed separately for each of the even- and odd-numbered word lines WL.

In step S4, it is determined whether the write loop counts of the memory cells connected to the even- and odd-numbered word lines WL equal the target loop count. The target loop count is, for example, an arbitrary count determined for each chip. That is, the write voltages VPGM_EVEN and VPGM_ODD are set such that the write loop counts of the memory cells connected to the even- and odd-numbered word lines WL become equal. This makes it possible to equalize the write speeds of the memory cells corresponding to the even- and odd-numbered word lines WL.

If the write loop counts of the memory cells connected to the even- and odd-numbered word lines WL equal the target loop count in step S4, the required write voltages VPGM_EVEN and VPGM_ODD are stored in step S5. More specifically, the data of the write voltages are stored in, for example, the ROM FUSE 9 or a storage circuit in the memory cell array 1 shown in FIG. 1. Note that the target loop count value is not necessarily limited to one value, and values included within a predetermined range may be set as target loop counts.

If the write loop counts of the memory cells connected to the even- and odd-numbered word lines WL are different from the target loop count in step S4, the write voltage VPGM(N) is changed to a write voltage VPGM(N+1) in step S6, and the processing in steps S1 to S5 is then performed. That is, the above-described processing is repeated until the write loop counts of the memory cells connected to the even- and odd-numbered word lines WL become equal the target loop count.

Figure 7:
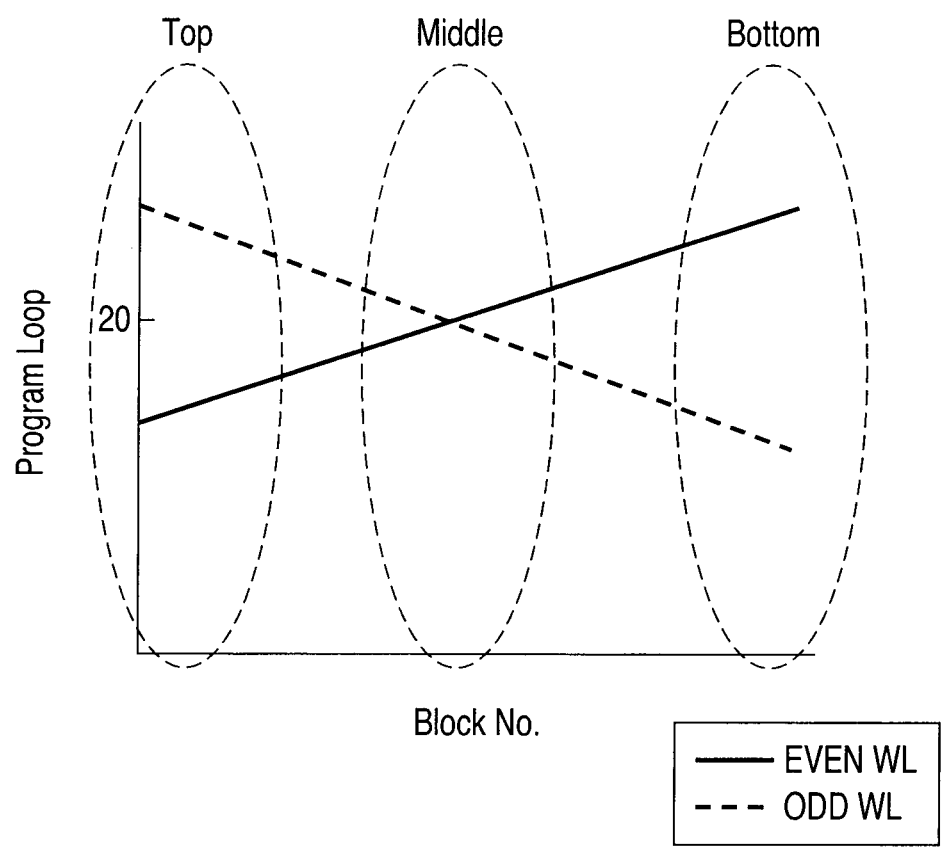
FIG. 7 is a graph showing the write loop count of each block in trimming.

FIG. 7 shows the write loop count of each block upon applying the same write voltage to the even- and odd-numbered word lines WL of all blocks in trimming shown in FIG. 6.

As shown in FIG. 7, when for example, the write voltage is defined as VPGM, and the target loop count is set to 20, the write loop counts of the memory cells connected to the even- and odd-numbered word lines WL equal the target loop count in a Middle block on the chip. At this time, for example, VPGM_EVEN=VPGM and VPGM_ODD=VPGM are stored in the ROM FUSE 9 as required voltage values in the Middle block.

On the other hand, in a Top block and Bottom block, the write loop counts of the memory cells connected to the even- and odd-numbered word lines WL are different from the target loop count.

More specifically, in the Top block, the write loop count of the memory cells connected to the even-numbered word lines WL is smaller than the target loop count, whereas the write loop count of the memory cells connected to the odd-numbered word lines WL is larger than the target loop count. For this reason, for example, VPGM_EVEN=VPGM−s (s is a positive value) and VPGM_ODD=VPGM+t (t is a positive value) are stored in the ROM FUSE 9 as required voltage values.

In the Bottom block, the write loop count of the memory cells connected to the even-numbered word lines WL is larger than the target loop count, whereas the write loop count of the memory cells connected to the odd-numbered word lines WL is smaller than the target loop count. For this reason, for example, VPGM_EVEN=VPGM+u (u is a positive value) and VPGM_ODD=VPGM−v (v is a positive value) are stored in the ROM FUSE 9 as required voltage values.

That is, the write voltage correction values are set for, e.g., blocks in three regions of the chip. Note that the correction values may be set not for three regions but for four or more blocks of the chip.

[Effects]

According to the above-described first write method, when the dimensions of two adjacent memory cells (memory cells connected to even- and odd-numbered word lines WL) are different, the write voltage and write pass voltage are corrected in accordance with the write characteristic. More specifically, for example, the correction value a of the write pass voltage to be applied to the odd-numbered word line WL is set in accordance with the correction value b, trimmed in advance, of the write voltage to be applied to the odd-numbered word line WL. Write pass voltages of required values are so applied to the even- and odd-numbered word lines WL separately. It is therefore possible to reduce the number of defective bits generated by the difference in gate electrode dimension between two adjacent memory cells and improve the reliability of write operation.

Note that although a case in which the dimensions of two adjacent memory cells are different has been described in this embodiment, the embodiment is not limited to this. Even when the dimensions of three or more adjacent memory cells are different, the write voltage and write pass voltage can be corrected in accordance with the write characteristic.

Figure 8:
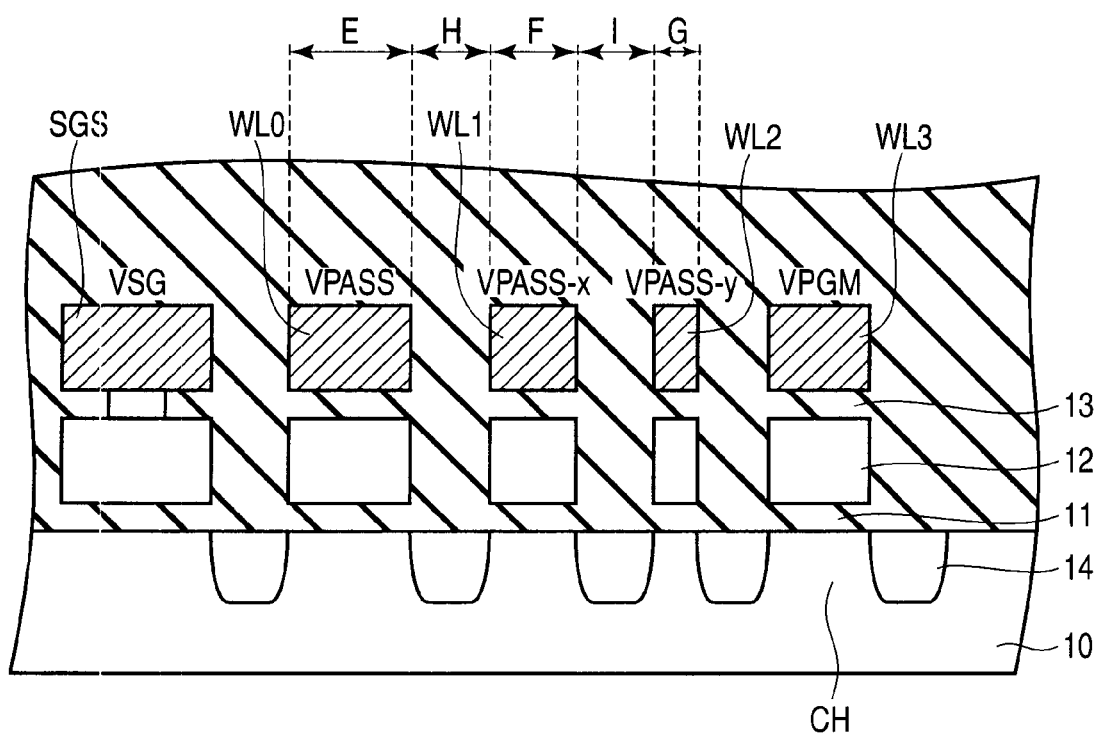
FIG. 8 is a sectional view showing a modification of the first write method for memory cells according to the embodiment.

For example, FIG. 8 shows a case in which three adjacent memory cells connected to the word lines WL0, WL1, and WL2 have different gate electrode dimensions. More specifically, in FIG. 8, a dimension E of the gate electrode of the memory cell connected to the word line WL0 is larger than a dimension F of the gate electrode of the memory cell connected to the word line WL1. In addition, the dimension F of the gate electrode of the memory cell connected to the word line WL1 is larger than a dimension G of the gate electrode of the memory cell connected to the word line WL2. Hence, the write pass voltage VPASS is applied to the word line WL0, a write pass voltage VPASS-x (x is a positive or negative value) is applied to the word line WL1, and a write pass voltage VPASS-y (y is a positive or negative value) is applied to the word line WL2. The values x and y are, for example, different values. According to this arrangement, required write pass voltages can be set separately for three gate electrodes having different dimensions.

In some cases, the dimensions (spaces) between adjacent memory cells are different. More specifically, a dimension H between the memory cell connected to the word line WL0 and that connected to the word line WL1 is different from a dimension I between the memory cell connected to the word line WL1 and that connected to the word line WL2. Similarly, in some cases, the width of the diffusion layer 14 or the impurity concentration differs between adjacent memory cells. In the first write method, the write voltage and write pass voltage can be corrected in accordance with the write characteristic even based on these factors.

The first write method is applicable to binary or multi-level write.

[Second Write Method]

A second write method according to this embodiment will be described below with reference to FIGS. 9, 10A, 10B, 11A, and 11B. The second write method is applicable to multi-level write. Quaternary write will be described here. However, this embodiment is not limited to this, and is also applicable to write of eight or more values.

Figure 9:
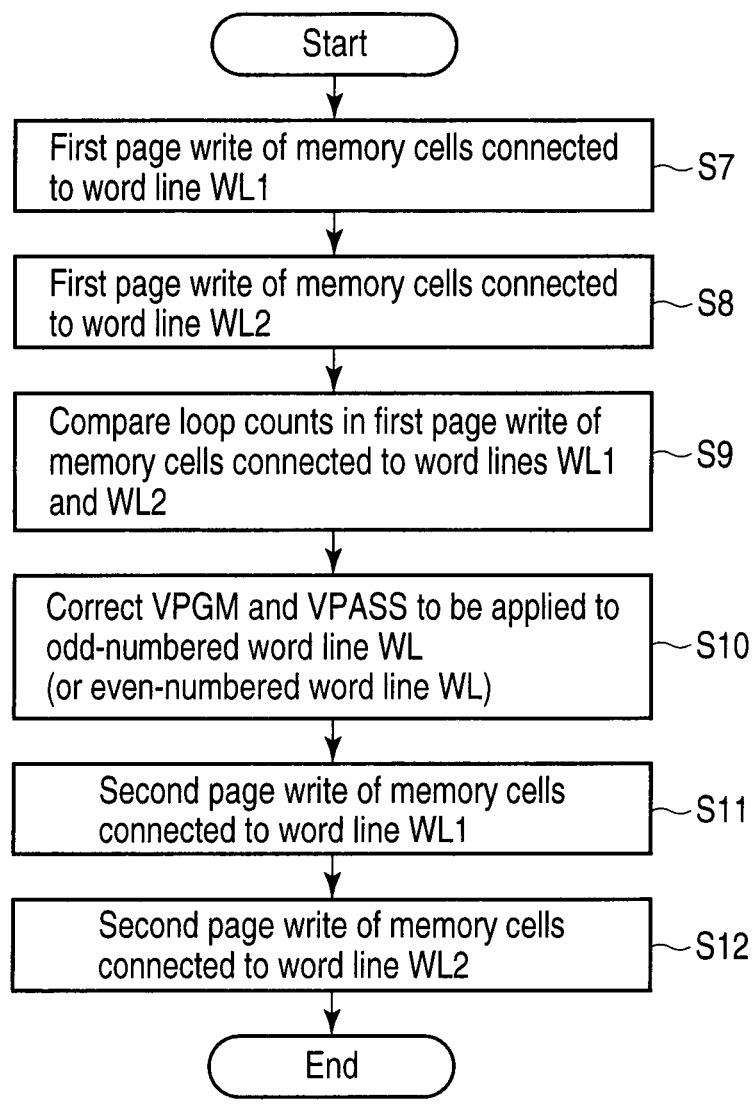
FIG. 9 is a flowchart of a second write method for memory cells according to the embodiment.
Figure 10:
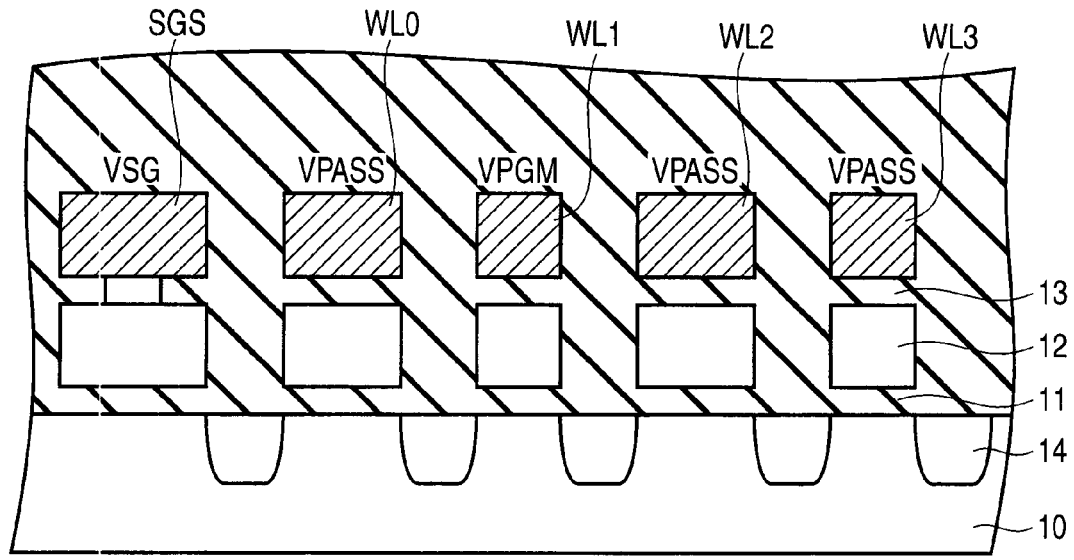
FIG. 10A is a sectional view showing an example of first page write in the second write method for memory cells according to the embodiment.
FIG. 10B is a sectional view showing another example of first page write in the second write method for memory cells according to the embodiment.
Figure 10:
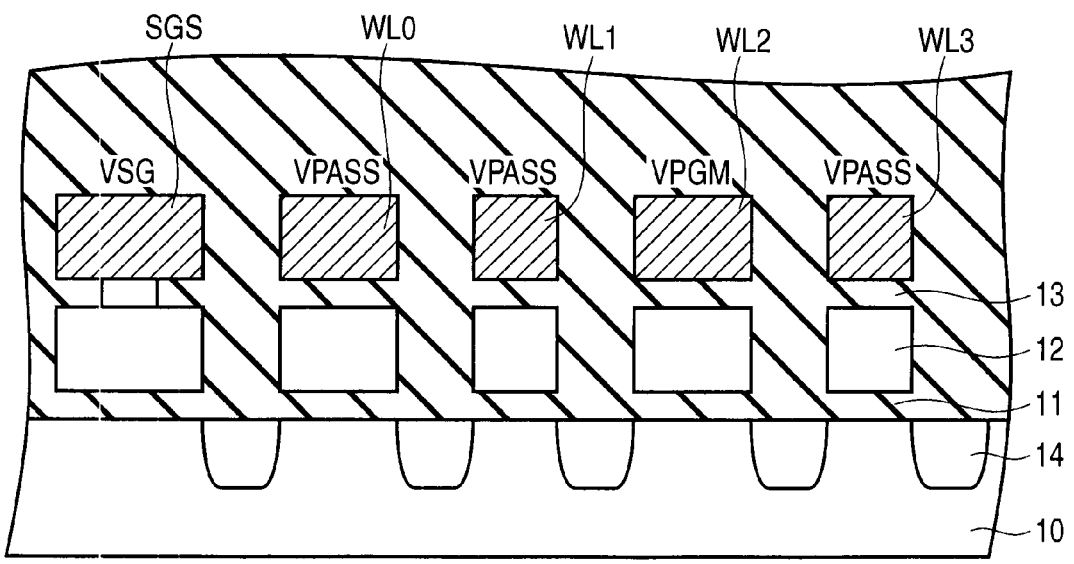
Figure 11A:
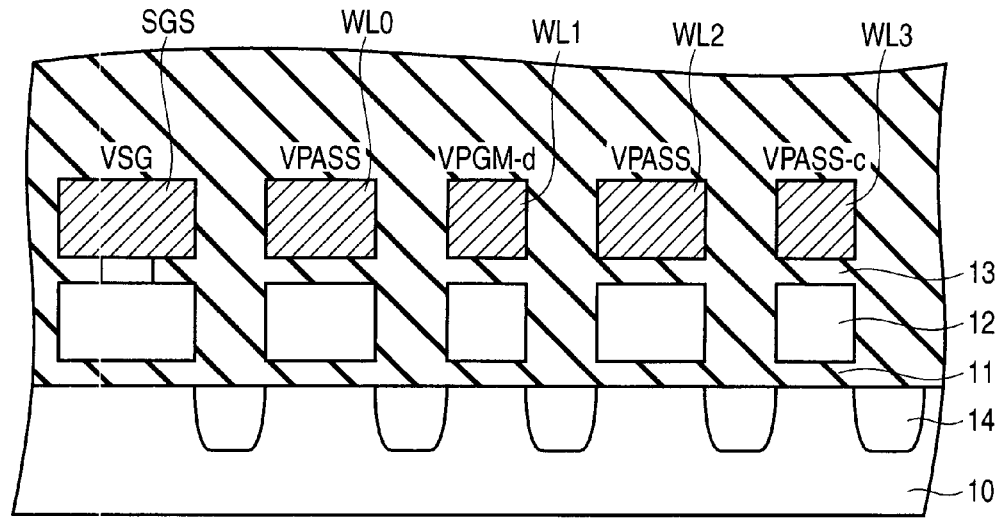
FIG. 11A is a sectional view showing an example of second page write in the second write method for memory cells according to the embodiment.
Figure 11B:
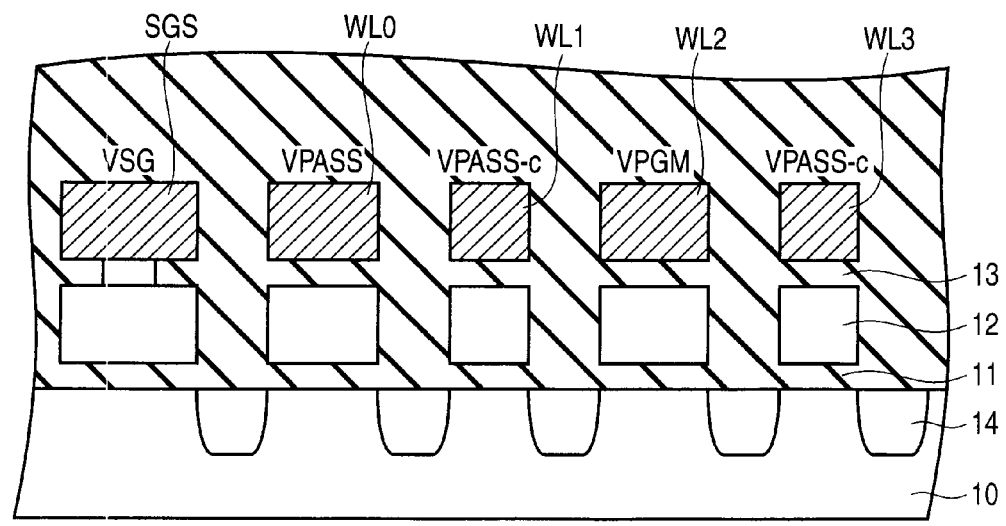
FIG. 11B is a sectional view showing another example of second page write in the second write method for memory cells according to the embodiment.

FIG. 9 is a flowchart of the second write method. FIG. 10A shows first page write of the memory cells connected to the word line WL1. FIG. 10B shows first page write of the memory cells connected to the word line WL2. FIG. 11A shows second page write of the memory cells connected to the word line WL1. FIG. 11B shows second page write of the memory cells connected to the word line WL2. Note that the following operations are controlled by the control signal/control voltage generation circuit 7 shown in FIG. 1.

As shown in FIG. 9, in step S7, first page write of the memory cells connected to the word line WL1 is performed. More specifically, as shown in FIG. 10A, the write voltage VPGM is applied to the word line WL1, the write pass voltage VPASS is applied to the word lines WL0, WL2, and WL3, and the select gate voltage VSG is applied to the select line SGS. After the write operation, a verify operation is performed. If there is a memory cell whose threshold voltage has not reached the verify level, the write voltage is stepped up, and the write operation is performed again for the memory cell with the threshold voltage below the verify level. This operation is repeated until the threshold voltage reaches the verify level in all memory cells of one page. At this time, the number of repetitions (loop count) is counted.

In step S8, first page write of the memory cells connected to the word line WL2 is performed. More specifically, as shown in FIG. 10B, the write voltage VPGM is applied to the word line WL2, the write pass voltage VPASS is applied to the word lines WL0, WL1, and WL3, and the select gate voltage VSG is applied to the select line SGS. After the write operation, the write operation is repeated until the threshold voltage reaches the verify level in all memory cells of one page, and the number of loops is counted, as described above.

In step S9, the loop count in first page write of the memory cells connected to the word line WL1 is compared with that in first page write of the memory cells connected to the word line WL2. At this time, since the even- and odd-numbered word lines WL have a difference in dimension, the write loop counts are different.

Assume that in step S9, for example, the loop count in first page write of the memory cells connected to the word line WL1 is four, and that in first page write of the memory cells connected to the word line WL2 is five. In this case, in step S10, the correction values of the write voltage VPGM and write pass voltage VPASS to be applied to, for example, the odd-numbered word lines WL1 and WL3 (or even-numbered word lines WL2 and WL4) are set in accordance with the loop count difference. The correction values are stored in the ROM FUSE 9 shown in FIG. 1.

In step S11, reflecting the correction values set in step S10, second page write of the memory cells connected to the word line WL1 is performed. More specifically, as shown in FIG. 11A, a write voltage VPGM-d (d is a positive or negative value) is applied to the word line WL1, the write pass voltage VPASS is applied to the word lines WL0 and WL2, a write pass voltage VPASS-c (c is a positive or negative value) is applied to the word line WL3, and the select gate voltage VSG is applied to the select line SGS.

In step S12, reflecting the correction values set in step S10, second page write of the memory cells connected to the word line WL2 is performed. More specifically, as shown in FIG. 11B, the write voltage VPGM is applied to the word line WL2, the write pass voltage VPASS is applied to the word line WL0, the write pass voltage VPASS-c is applied to the word lines WL1 and WL3, and the select gate voltage VSG is applied to the select line SGS.

[Effects]

According to the above-described second write method, the same effects as in the first write method can be obtained.

Additionally, in the second write method, when two adjacent multi-level memory cells have different gate electrode dimensions, the loop counts in first page write of the memory cells are compared. The correction value c of the write pass voltage is thus detected. Based on the correction value c, the write pass voltage to be applied to, for example, the odd-numbered word line WL is set. The correction value c is detected by actually performing the write operation for the memory cells. For this reason, the correction value c can be set more accurately than the correction value a, which is set in accordance with the write voltage correction value b trimmed in advance based on the result of die sorting test. It is therefore possible to obtain higher reliability of write operation than in the first write method.

Note that when write/erase is repeated, the loop count difference in first page write is eliminated, and detecting the correction values for the even- and odd-numbered word lines WL is difficult. To prevent this, preferably, the loop counts in first page write in the fresh state (first write) are compared, and the result is stored in the ROM FUSE 9 as data, thereby setting the correction values in the subsequent write operations (first second page write, page write after write loop count comparison, and second and subsequent write operations after data erase).

The loop count difference between the even- and odd-numbered word lines WL appears more remarkably in second page write than in first page write. For this reason, the correction values in the subsequent write operations (second and subsequent write operations after data erase) may be set by comparing the loop counts in second page write and storing the result in the ROM FUSE 9 as data.

In the second write method, an example of multi-level write has mainly been described. Even binary write, the correction values in the subsequent write operations (page write after write loop count comparison and second and subsequent write operations after data erase) may be set by comparing the loop counts in first page write and storing the result as data.

In the second write method as well, correction value setting can be performed in each block, as in the first write method.

Although a case in which the dimensions of two adjacent memory cells are different has been described in this embodiment, the embodiment is not limited to this. Even when the dimensions of three or more adjacent memory cells are different, the write voltage and write pass voltage can be corrected in accordance with the write characteristic.

[Read Method]

A read method according to the embodiment will be described below with reference to FIG. 12.

FIG. 12 illustrates the read method for memory cells according to the embodiment. FIG. 12 shows a case in which in the read operation, all the memory cells connected to the word lines WL0 to WL3 are non-read target cells.

As shown in FIG. 12, when the memory cells connected to the word lines WL0 to WL3 are non-read target cells in the read operation, read pass voltages are applied to the word lines WL0 to WL3, and the select gate voltage VSG is applied to the select line SGS.

More specifically, a read pass voltage Vread is applied to the even-numbered word lines WL0 and WL2 connected to the non-read target cells. On the other hand, a read pass voltage Vread-e (e is a positive or negative value) is applied to the odd-numbered word lines WL1 and WL3 connected to the non-read target cells. The value e is determined in accordance with the correction value b used in the first write method. The value e is, for example, proportional to the value b, but is mainly defined by the dimension of the memory cell (or channel length, diffusion layer width, impurity concentration, or space).

[Effects]

According to the above-described read method, when two adjacent memory cells have different dimensions, the read pass voltage is corrected in accordance with the characteristic. More specifically, for example, the correction value e of the read pass voltage to be applied to the odd-numbered word line WL is set in accordance with the correction value b, trimmed in advance, of the write voltage to be applied to the odd-numbered word line WL. Read pass voltages of required values are so applied to the even- and odd-numbered word lines separately. It is therefore possible to reduce the number of defective bits generated after read stress by the difference in dimension between two adjacent memory cells and improve the reliability of read operation.

Although a case in which the dimensions of two adjacent memory cells are different has been described in this embodiment, the embodiment is not limited to this. Even when the dimensions of three or more adjacent memory cells are different, the read pass voltage can be corrected in accordance with the characteristic.

[Erase Method]

An erase method according to the embodiment will be described below with reference to FIGS. 13A and 13B.

Figure 13A:
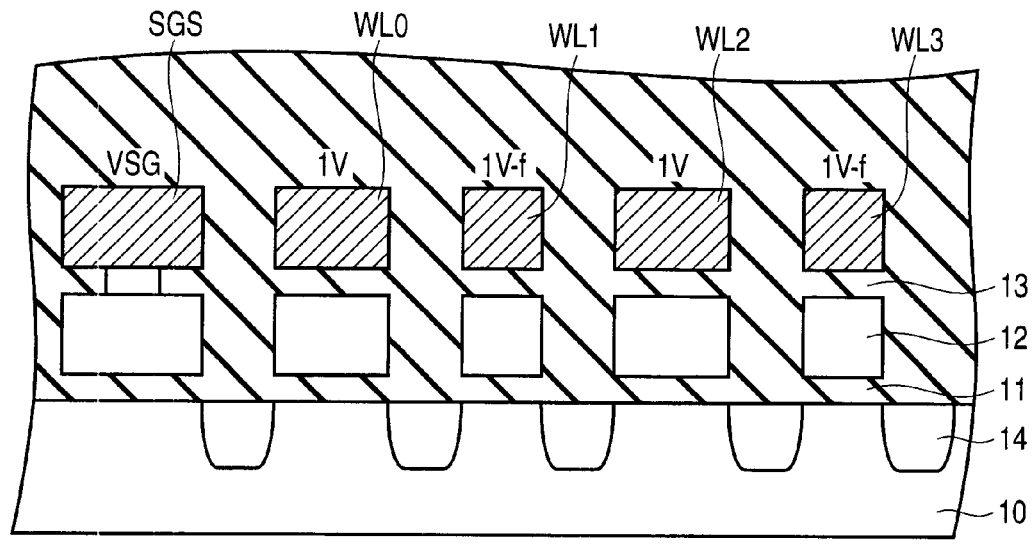
FIG. 13A is a sectional view showing an example of an erase method for memory cells according to the embodiment.
Figure 13B:
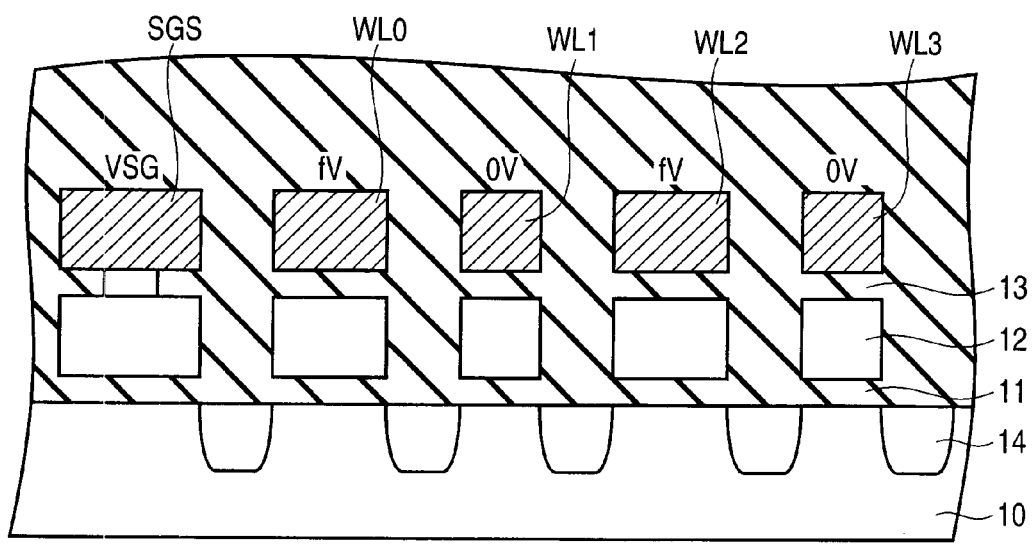
FIG. 13B is a sectional view showing another example of the erase method for memory cells according to the embodiment.

FIGS. 13A and 13B show the erase method for memory cells according to the embodiment.

Normally, to erase data in a memory cell, the word line is set to 0 V, and an erase voltage Vera is applied to the well. In this embodiment, however, to erase data in memory cells, the select gate voltage VSG is applied to the select line SGS, and 1 V is applied to the even-numbered word lines WL0 and WL2, as shown in FIG. 13A. On the other hand, (1 V−f) (f is a positive or negative value whose absolute value is smaller than 1) is applied to the odd-numbered word lines WL1 and WL3. In addition, an erase voltage (Vera+1 V) is applied to the well. The value f is determined in accordance with the correction value b used in the first write method. The value f is, for example, proportional to the value b, but is mainly defined by the dimension of the memory cell (or channel length, diffusion layer width, impurity concentration, or space). Voltages are applied to the word lines WL0 to WL3 based on 1 V not to apply negative charges to the word lines WL by the correction value f.

FIG. 13B shows a modification of the method in FIG. 13A in which the value f is positive. In this case, the select gate voltage VSG is applied to the select line SGS, and f V is applied to the even-numbered word lines WL0 and WL2. On the other hand, the odd-numbered word lines WL1 and WL3 are set to 0 V. That is, since it is impossible to apply a negative voltage to the word lines WL, the lower one of the voltages to be applied to the even- and odd-numbered word lines WL is set to 0 V, and the correction value f is applied as the higher one.

[Effects]

According to the above-described erase method, when two adjacent memory cells have different dimensions, the voltages of the word lines WL in erase are corrected in accordance with the characteristic. More specifically, for example, the correction value f of the voltage in erase, which is to be applied to the odd-numbered word line WL (or even-numbered word line WL), is set in accordance with the correction value b, trimmed in advance, of the write voltage to be applied to the odd-numbered word line WL (or even-numbered word line WL). Voltages of required values are so applied to the even- and odd-numbered word lines separately. It is therefore possible to reduce the threshold voltage error generated after erase by the difference in dimension between two adjacent memory cells and improve the reliability of erase operation.

Although a case in which the dimensions of two adjacent memory cells are different has been described in this embodiment, the embodiment is not limited to this. Even when the dimensions of three or more adjacent memory cells are different, the voltages of the word lines WL in erase can be corrected in accordance with the characteristic.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a first memory cell connected to a first word line;
    a second memory cell connected to a second word line which is adjacent to the first word line and has a width different from a width of the first word line; and
    a control circuit which applies a first voltage to the first word line and a second voltage different from the first voltage to the second word line,
    wherein at least one of the first voltage and the second voltage is a voltage corrected by the control circuit based on loop counts of the first memory cell and the second memory cell in an nth-write (n is natural number) operation of the first memory cell and the second memory cell, and the control circuit applies the first voltage to the first word line in an mth-write (m is natural number larger than n) of the first memory cell after the nth-write operation of the first memory cell and the second memory cell or applies the second voltage to the second word line in the mth-page write mth-write operation of the second memory cell after the nth-write operation of the first memory cell and the second memory cell.

2. The device of claim 1, further comprising a third memory cell connected to a third word line which is adjacent to the second word line on a side opposite to the first word line and has a width substantially equal to the width of the first word line,
    wherein the control circuit applies a third voltage equal to the first voltage to the third word line.

3. The device of claim 2, wherein a dimension between the first memory cell and the second memory cell is different from a dimension between the second memory cell and the third memory cell.

4. The device of claim 2, wherein at least one of an impurity concentration and a dimension of a source/drain diffusion layer formed between the first memory cell and the second memory cell is different from at least one of an impurity concentration and a dimension of a source/drain diffusion layer formed between the second memory cell and the third memory cell.

5. The device of claim 1, wherein
    memory cells including the first memory cell and the second memory cell to which current paths are connected in series are arranged in a row direction to form a block, and
    the control circuit corrects, for each block, at least one of the first voltage and the second voltage based on the loop counts of the first memory cell and the second memory cell.

6. The device of claim 1, wherein the first voltage and the second voltage are write pass voltages to be applied when the first memory cell and the second memory cell are non-write target cells in the second write operation.

7. The device of claim 1, wherein the first voltage and the second voltage are read pass voltages to be applied when the first memory cell and the second memory cell are non-read target cells in a read operation.

8. The device of claim 1, wherein the first voltage and the second voltage are voltages to be applied in an erase operation.

9. A nonvolatile semiconductor memory device comprising:
    a block formed by arranging memory cells to which current paths are connected in series in a row direction,
    the block including,
        first memory cells connected to a first word line, and
        second memory cells connected to a second word line; and
    a control circuit which applies a first voltage to the first word line and a second voltage different from the first voltage to the second word line,
    wherein at least one of the first voltage and the second voltage is a voltage corrected by the control circuit based on loop counts of the first memory cells and the second memory cells in an nth-write (n is natural number) operation of the first memory cell and the second memory cell, and the control circuit applies the first voltage to the first word line in an mth-write (m is natural number larger than n) operation of the first memory cell after the nth-write operation of the first memory cell and the second memory cell or applies the second voltage to the second word line in the mth-write operation of the second memory cell after the nth-write operation of the first memory cell and the second memory cell.

10. The device of claim 9, wherein a write characteristic of the first memory cells is different from a write characteristic of the second memory cells.

11. The device of claim 9, wherein a width of the first word line is different from a width of the second word line.

12. The device of claim 11, wherein
the block further includes third memory cells connected to a third word line,
the second word line is adjacent to the first word line,
the third word line is adjacent to the second word line and has a width substantially equal to a width of the first word line, and
the control circuit applies a third voltage equal to the first voltage to the third word line.

13. The device of claim 9, wherein the control circuit corrects, for each block, at least one of the first voltage and the second voltage based on the loop counts of the first memory cells and the second memory cells.

14. The device of claim 9, wherein the first voltage and the second voltage are write pass voltages to be applied when the first memory cells and the second memory cells are non-write target cells in the second write operation.

15. The device of claim 9, wherein the first voltage and the second voltage are read pass voltages to be applied when the first memory cells and the second memory cells are non-read target cells in a read operation.

16. The device of claim 9, wherein the first voltage and the second voltage are voltages to be applied in an erase operation.

* * * * *